United States Patent
Ha

(10) Patent No.: US 7,336,686 B2
(45) Date of Patent: Feb. 26, 2008

(54) LASER DISPLAY APPARATUS

(75) Inventor: Kyoung-ho Ha, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 2 days.

(21) Appl. No.: 11/500,908

(22) Filed: Aug. 9, 2006

(65) Prior Publication Data

US 2007/0133630 A1 Jun. 14, 2007

(30) Foreign Application Priority Data

Dec. 14, 2005 (KR) .................. 10-2005-0123160

(51) Int. Cl.
*H01S 3/00* (2006.01)
(52) U.S. Cl. ................................ 372/26; 372/24
(58) Field of Classification Search ............... 372/26
See application file for complete search history.

(56) References Cited

U.S. PATENT DOCUMENTS 5,274,494 A 12/1993 Rafanelli et al.
6,577,429 B1 * 6/2003 Kurtz et al. ................ 359/279

2004/0076203 A1 * 4/2004 Kaminsky et al. ............ 372/39

* cited by examiner

*Primary Examiner*—Dung T Nguyen
(74) *Attorney, Agent, or Firm*—Buchanan Ingersoll & Rooney PC

(57) ABSTRACT

Provided is a laser display apparatus in which speckle can be suppressed. The laser display apparatus includes: a laser comprising a first mirror and a second mirror that are separated by a cavity distance and form a cavity; and a spatial modulator modulating light transmitted through the first mirror of the laser to display an image on a screen, wherein, when a coherence length $l_c$ and an effective reflectivity R are defined by the following equation:

$$l_c = 2d \frac{\pi R^{1/2}}{1-R}$$
$$R = \sqrt{R_1 \times R_2}$$
[Equation]

where d is the cavity distance of the laser, $R_1$ is the reflectivity of the first mirror, and $R_2$ is the reflectivity of the second mirror, the coherence length $l_c$ satisfies the following inequality:

$$0 < l_c \leq 0.85 [\text{cm}].$$

6 Claims, 6 Drawing Sheets

LASER DISPLAY APPARATUS

CROSS-REFERENCE TO RELATED PATENT APPLICATION

Priority is claimed to Korean Patent Application No. 10-2005-0123160, filed on Dec. 14, 2005 in the Korean Intellectual Property Office, the disclosure of which is incorporated herein in its entirety by reference.

BACKGROUND OF THE DISCLOSURE

1. Field of the Disclosure

The present disclosure relates to a laser display apparatus having a laser light source, and more particularly, to a laser display apparatus in which a speckle can be suppressed.

2. Description of the Related Art

Generally, laser display apparatuses can be easily applied to projection displays due to the collimation of a laser beam. Moreover, the intensity of a laser beam is greater than the intensity of light generated from other light sources, and thus a laser can be used to realize a clear, large screen image.

A laser display apparatus uses a laser with high coherency, causing speckle. Speckle refers to coherent noise randomly occurring due to high coherency of a laser light source.

For example, when an image illustrated in FIG. 1A is to be realized on a screen by a laser display apparatus, the image is realized as illustrated in FIG. 1B due to the above described speckle.

U.S. Pat. No. 5,274,494 discloses a "Speckle Suppression Illuminator" which purports to suppress the above described speckle.

The "Speckle Suppression Illuminator" includes a Raman cell, which is a chamber storing a gas for dispersing incident light, in front of light sources radiating coherent light with a first wavelength. Accordingly, the illuminator provides a spatially coherent and temporally incoherent laser beam to reduce the intensity and occurrence area of the speckle.

However, since a Raman cell is in the path of the light radiated from the laser light source, the optical structure of the laser display apparatus is complicated and the number of manufacturing processes and costs are high.

SUMMARY OF THE DISCLOSURE

The present disclosure provides a laser display apparatus in which speckle is suppressed without the inclusion of any additional elements in the optical path.

According to an aspect of the present disclosure, there is provided a laser display apparatus comprising: a laser comprising a first mirror and a second mirror that are separated by a cavity distance and form a cavity; and a spatial modulator modulating light transmitted through the first mirror of the laser to display an image on a screen, wherein, when a coherence length $l_c$ and an effective reflectivity R of the laser are defined by the following equation:

$$l_c = 2d\frac{\pi R^{1/2}}{1-R}$$ [Equation]

$$R = \sqrt{R_1 \times R_2}$$

where d is the cavity distance of the laser, $R_1$ is the reflectivity of the first mirror, and $R_2$ is the reflectivity of the second mirror, the coherence length $l_c$ satisfies the following inequality:

$$0 < l_c \leq 0.85 [\text{cm}]$$ [Inequality]

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE DISCLOSURE

The present invention will now be described more fully with reference to the accompanying drawings, in which exemplary embodiments of the invention are shown.

Figure 1A:
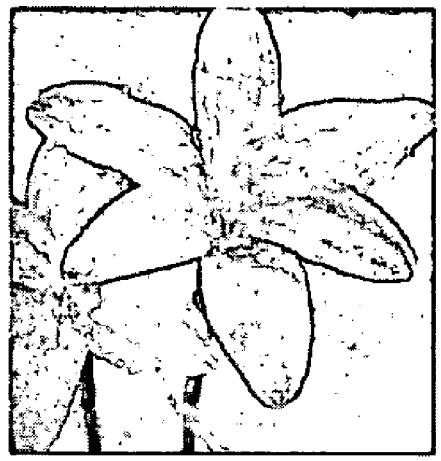
FIG. 1A is an original image.
Figure 1B:
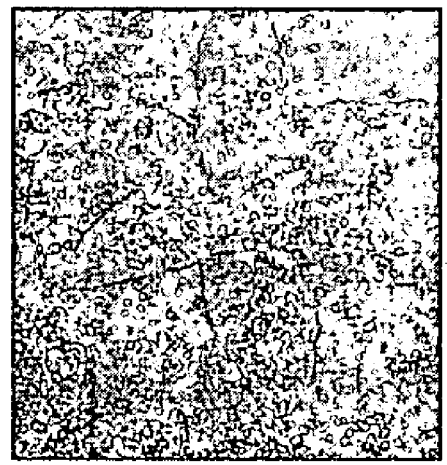
FIG. 1B is the image of FIG. 1A with speckle.
Figure 2:
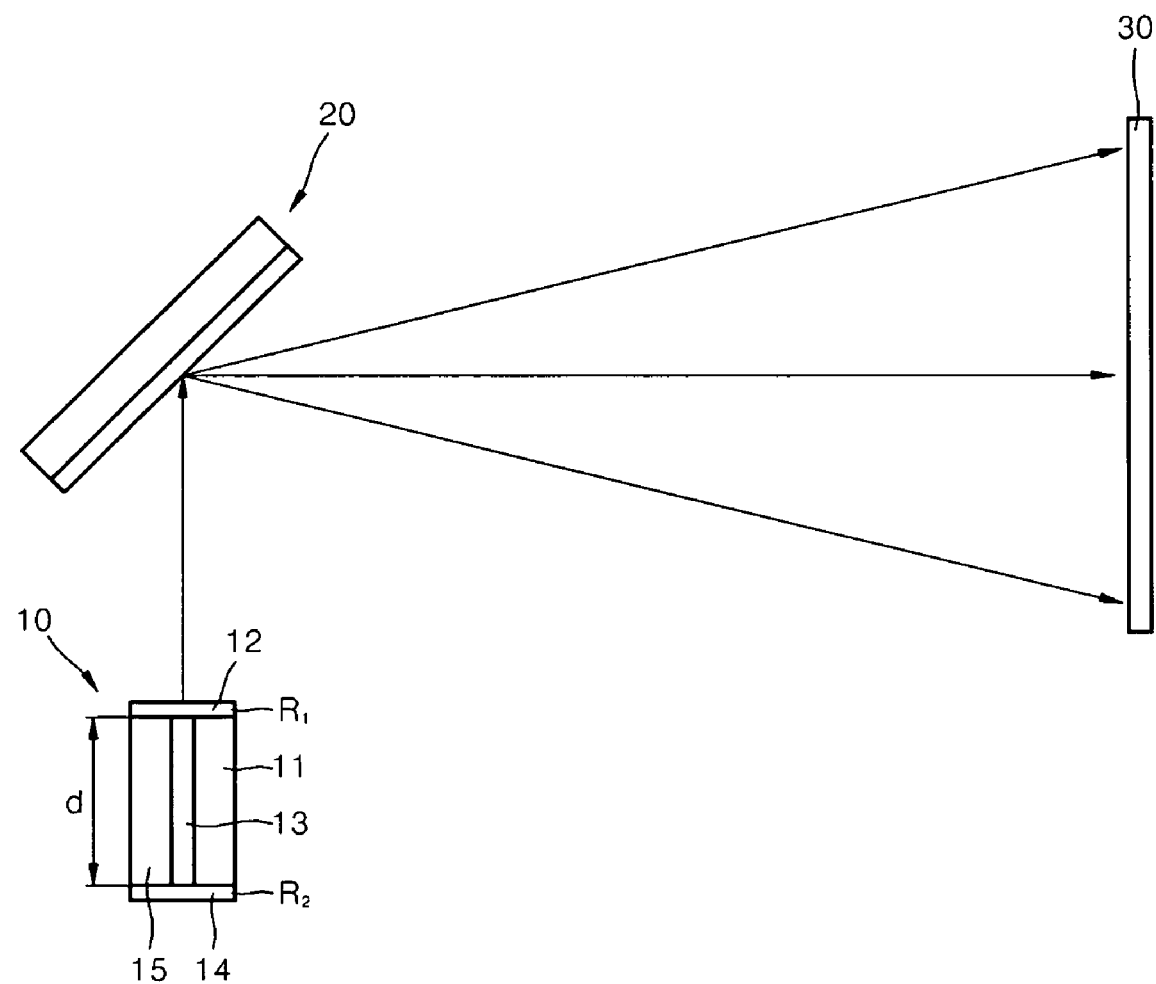
FIG. 2 is a schematic view of a laser display apparatus according to an embodiment of the present disclosure.

FIG. 2 illustrates the optical arrangement of a laser display apparatus according to an embodiment of the present disclosure. Referring to FIG. 2, the laser display apparatus scans laser light onto a screen 30, and includes a laser 10, and a spatial modulator 20 modulating incident light to display an image on the screen 30.

The laser 10 includes first and second clad layers 11 and 15, an active layer 13 interposed between the first and second clad layers 11 and 15, and first and second mirrors 12 and 14 forming a cavity on a lateral side of the active layer 13 and the first and second clad layers 11 and 15 in this exemplary embodiment. The laser 10 radiates visible light with a wavelength ranging from about 400 nm to about 700 nm. The first mirror 12 and the second mirror 14 are separated from each other by a cavity distance d.

When power is supplied to the laser 10, a beam generated by the active layer 13 is resonated between the first mirror 12 and the second mirror 14 and only light with a predetermined wavelength is amplified and transmitted through the first mirror 12 and the second mirror 14, The spatial modulator 20 modulates the light transmitted through the first mirror 12 to display the image on the screen 30, In the present embodiment, the speckle contrast on the screen 30 is reduced by altering a coherence length $l_c$ by controlling the cavity distance d and effective reflectivity R of the laser 10, The relationship between the laser 10 and the coherence length $l_c$, which determines the speckle intensity on the screen 30, will now be described, and then the effective reflectivity R of the laser 10 and the optimisation of the cavity distance d will be described.

The coherence length $l_c$ with a narrow width equal to the width of the laser 10 can be expressed by Equation 1.

$$l_C = \frac{cF}{v_F}$$
$$= 2dF$$
$$= 2d\frac{\pi R^{1/2}}{1-R}$$ [Equation 1]

where c is the speed of light, F is the finesse in a Fabry-Perot cavity, $V_F$ is the number of modes for a given frequency, d is the cavity distance, and R is the effective reflectivity of the laser 10 defined by the following Equation 2.

$$R = \sqrt{R_1 \times R_2},$$ [Equation 2]

where $R_1$ is the reflectivity of the first mirror 12 and $R_2$ is the reflectivity of the second mirror 14, Referring to Equation 1, the coherence length $l_c$, which denotes the distance over which coherence is maintained, is dependent on the cavity distance d and the effective reflectivity R of the laser 10, Accordingly, as the effective reflectivity R and the cavity distance d are reduced, the coherency of the radiation beam is reduced and thus the speckle intensity on the screen 30 is reduced.

Figure 3:
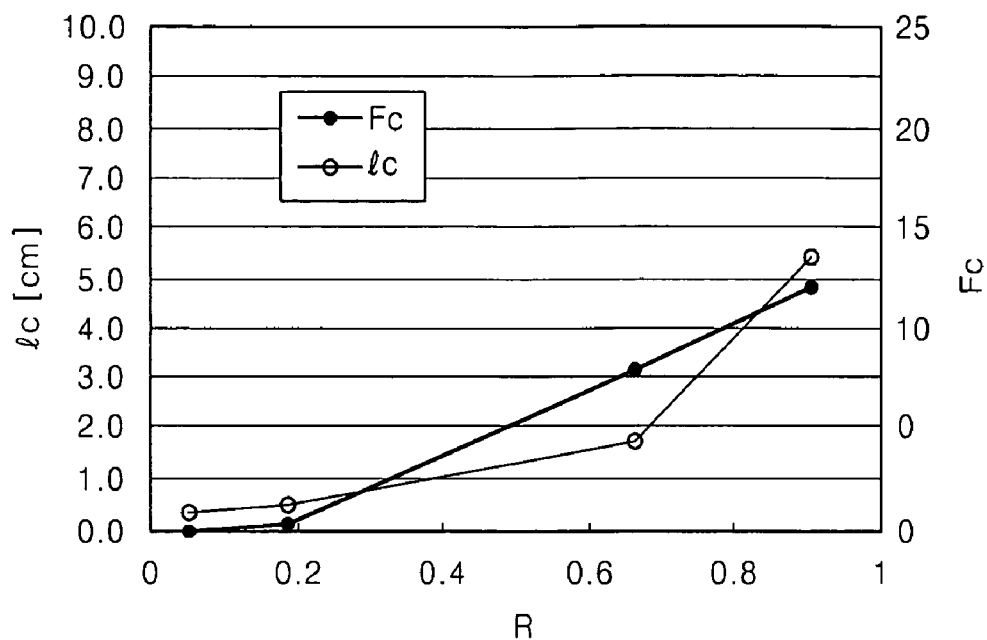
FIG. 3 is a graph illustrating coherence length with respect to effective reflectivity of a laser.

FIG. 3 is a graph illustrating the coherence length with respect to effective reflectivity of a laser. In detail, FIG. 3 illustrates the coherence length $l_c$ and the coherence factor $F_c$ of GaN type lasers with effective reflectivities of 90.5%, 66.6%, 18.7%, and 5.4%, respectively.

Referring to FIG. 3, as the effective reflectivity of the laser decreases, $l_c$ and $F_c$ decrease.

Figure 4:
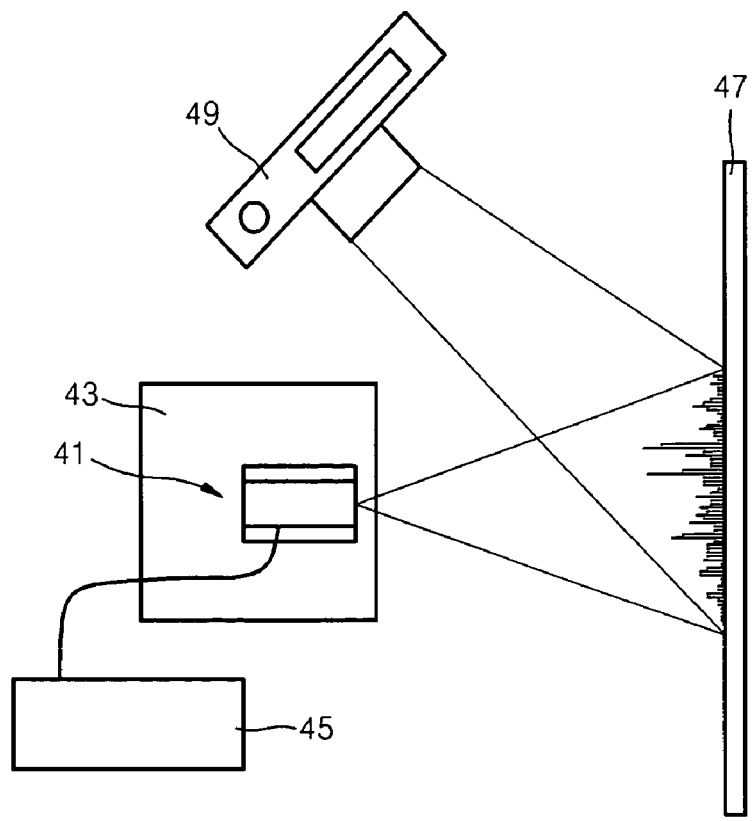
FIG. 4 illustrates how speckle contrast (Cs) is measured in a laser.

FIG. 4 is a schematic view of a device measuring the speckle contrast of a laser. The speckle contrast measuring device includes a GaN type laser 41 with effective reflectivities of 90.5%, 66.6%, 18.7%, and 5.4%, respectively, and a cavity distance of 650 μm mounted on a cooling device 43, The laser 41 is driven by a laser driving source 45 and a far-field of the laser 41 is projected on a screen 47 without a lens system. The image on the screen 47 is photographed with a camera 49, e.g. a digital camera with a manual function, with an F10 aperture and −2.0 EV exposure, and the speckle contrast Cs is calculated using Equations 3 through 5.

$$C_S = \frac{\sigma}{avg}$$ [Equation 3]

where $$\sigma = \sqrt{\frac{\sum_{n=1}^{N} |avg - I(n)|^2}{N}}$$ [Equation 4]

and $$avg = \frac{\sum_{n=1}^{N} I(n)}{N}$$ [Equation 5]

where l(n) is light intensity, N is the number of data, avg is the average light intensity, and σ is the standard deviation.

FIGS. 5A through 5D are photographs of images taken at effective reflectivities of 90.5%, 66.6%, 18.7%, and 5.4%, respectively. FIG. 6 is a graph of speckle contrast Cs with respect to effective reflectivity.

Figure 5A:
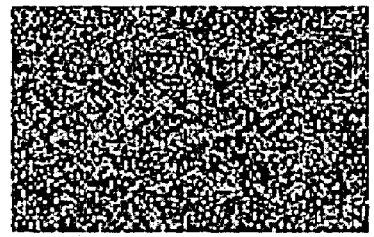
FIGS. 5A through 5D are photographs of images at effective reflectivities (R) of 90.5%, 66.6%, 18.7%, and 5.4%, respectively.
Figure 6:
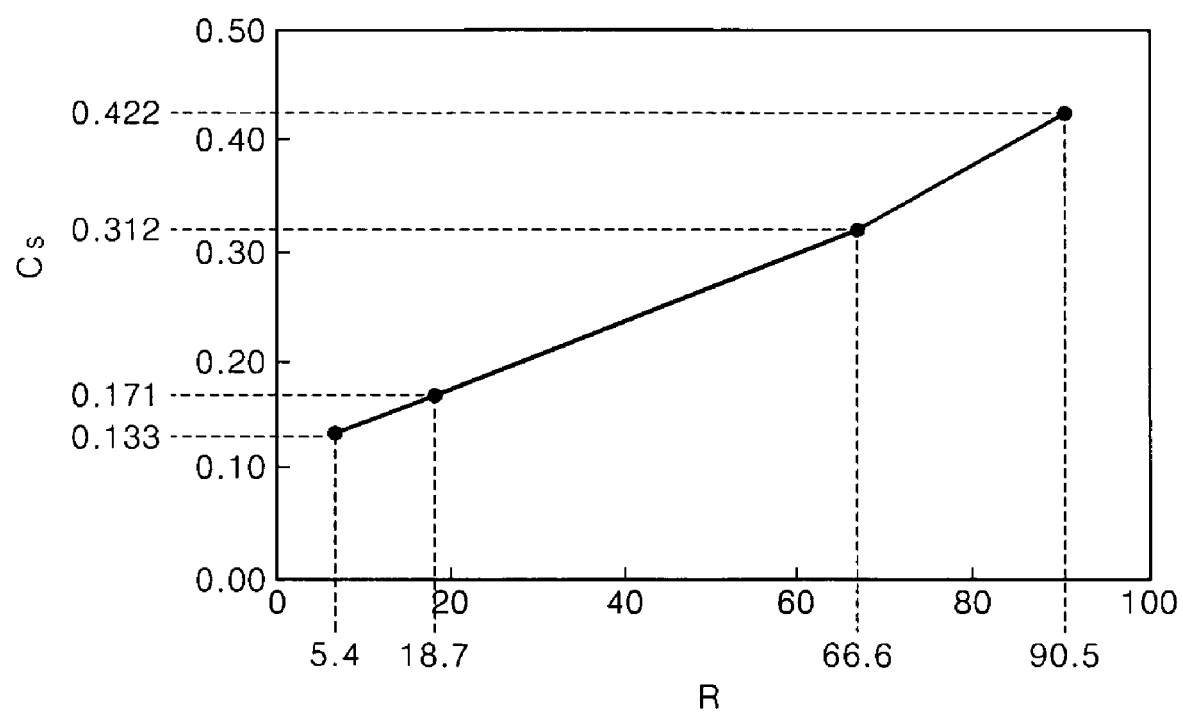
FIG. 6 is a graph of speckle contrast (Cs) with respect to effective reflectivity.

FIG. 5A is a photograph of an image projected onto a screen by a laser in which the reflectivity $R_1$ of the first mirror 12 and the reflectivity $R_2$ of the second mirror 14 are both 90.5%. The speckle contrast Cs is 0.422 and, as illustrated, the image has a rough speckle.

Figure 5B:
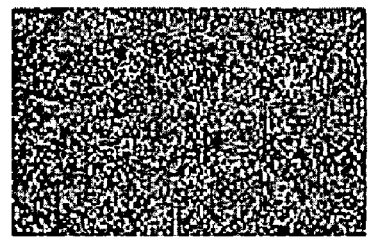

FIG. 5B is a photograph of an image projected onto the screen by a laser in which the reflectivity $R_1$ of the first mirror 12 is 66.6% and the reflectivity $R_2$ of the second mirror 14 is 90.5%. The speckle contrast Cs is 0.312 and the speckle is relatively smaller than in FIG. 5A.

Figure 5C:

FIG. 5C is a photograph of an image projected onto the screen by a laser in which the reflectivity $R_1$ of the first mirror 12 is 18.7% and the reflectivity $R_2$ of the second mirror 14 is 90.5%. The speckle contrast Cs is 0.171 and the speckle is much smaller than in FIGS. 5A and 5B.

Figure 5D:
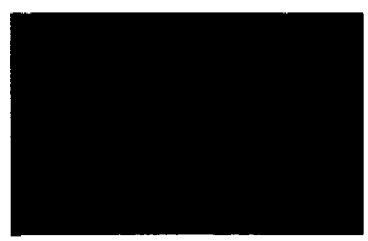

FIG. 5D is a photograph of an image projected onto the screen by a laser in which the reflectivity $R_1$ of the first mirror 12 is 5.4% and the reflectivity $R_2$ of the second mirror 14 is 90.5%. The speckle contrast Cs is 0.133 and the image has barely any speckle.

As described above, as the reflectivity R of the laser is reduced from 90.5% to 5.4%, the coherency is decreased and, as illustrated in FIG. 6, the speckle contrast Cs can be reduced by as much as one third.

Meanwhile, the coherence length $l_c$ does not only depend on the effective reflectivity R but also on the cavity distance d as shown in Equation 1. Also, the coherence length $l_c$ which is defined by the cavity distance d and the effective reflectivity R is related to the variation of the speckle contrast Cs.

Figure 7:
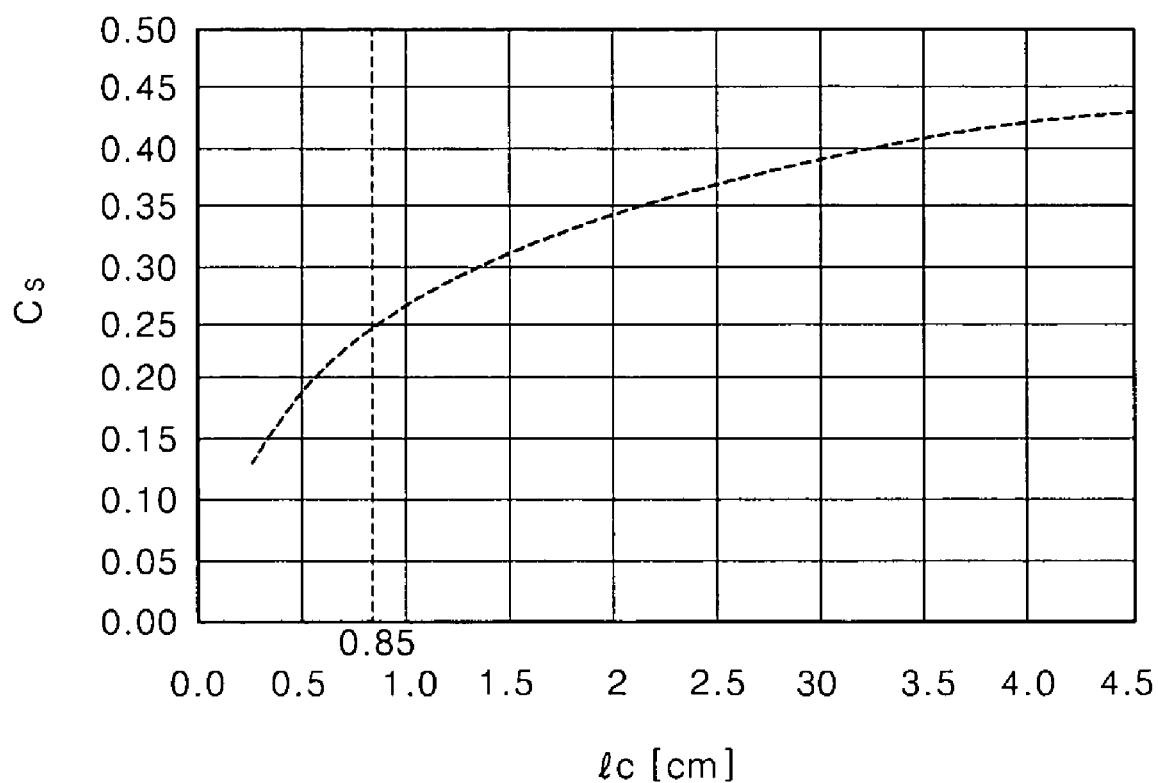
FIG. 7 is a graph of speckle contrast (Cs) with respect to coherence length.

FIG. 7 is a graph of speckle contrast with respect to coherence length $l_c$. Referring to FIG. 7, as the coherence length $l_c$ increases, the speckle contrast Cs increases, leveling out at high coherence lengths. For example, when $l_c$ is 0.85 cm, Cs is 0.25 or less, and when $l_c$ is greater than 0.85 cm, Cs is greater than 0.25.

Accordingly, the laser can be improved without additional optical element or a radio frequency (RF) driving device.

That is, referring to FIG. 2, the laser 10 has a coherence length $l_c$ which satisfies the following inequality.

$$0 < l_c \leq 0.85 [cm]$$ [Equation 6]

The above inequality is determined according to the relationship between the coherence length $l_c$ and the speckle contrast Cs, and when the coherence length $l_c$ exceeds 0.85 cm, the speckle contrast Cs exceeds 0.25, and thus the speckle on the screen becomes large.

The laser 10 comprises a semiconductor laser or a diode pumped solid state (DPSS) laser. If the laser 10 comprises a semiconductor laser, the cavity distance d may satisfy the following inequality while simultaneously satisfying Equation 6.

$$100 \leq d \leq 5000 \ [\mu m]$$ [Equation 7]

If the laser 10 comprises a diode pumped solid state (DPSS) laser, the cavity distance d may satisfy the following inequality while simultaneously satisfying Equation 6.

$$1 \leq d \leq 50 \ [mm]$$ [Equation 8]

As described above, the laser display apparatus can suppress speckle on a screen without the inclusion of any additional components by controlling the effective reflectivity and/or cavity distance in the laser and thus optimising the coherence length $l_c$.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A laser display apparatus comprising:
   a laser comprising a first mirror and a second mirror that are separated by a cavity distance and form a cavity; and
   a spatial modulator modulating light transmitted through the first mirror of the laser to display an image on a screen,
   wherein, when a coherence length $l_c$ and an effective reflectivity R of the laser are defined by the following equation:

$$l_c = 2d \frac{\pi R^{1/2}}{1-R} \qquad \text{[Equation]}$$
   $$R = \sqrt{R_1 \times R_2}$$

where d is the cavity distance of the laser, $R_1$ is the reflectivity of the first mirror, and $R_2$ is the reflectivity of the second mirror, the coherence length $l_c$ satisfies the following inequality:

$$0 < l_c \leqq 0.85 \text{[cm]}.$$

2. The laser display apparatus of claim 1, wherein the laser comprises a semiconductor laser.

3. The laser display apparatus of claim 2, wherein the cavity distance d satisfies $100 \leqq d \leqq 5000$ [μm].

4. The laser display apparatus of claim 1, wherein the laser comprises a diode pumped solid state laser.

5. The laser display apparatus of claim 4, wherein the cavity distance d satisfies $1 \leqq d \leqq 50$ [mm].

6. The laser display apparatus of claim 1, wherein the laser radiates visible light with a wavelength ranging from about 400 nm to about 700 nm.

* * * * *